United States Patent
Shen et al.

(10) Patent No.: US 7,649,416 B2
(45) Date of Patent: Jan. 19, 2010

(54) LOAD INDUCTOR SHARING

(75) Inventors: David H. Shen, San Jose, CA (US);
James Burnham, Sunnyvale, CA (US);
Ali Tabatabaei, San Francisco, CA (US); Ann P. Shen, Saratoga, CA (US)

(73) Assignee: NanoAmp Mobile, Inc., Santa Clara, CA (US)

( * ) Notice: Subject to any disclaimer, the term of this patent is extended or adjusted under 35 U.S.C. 154(b) by 0 days.

(21) Appl. No.: 12/236,344

(22) Filed: Sep. 23, 2008

(65) Prior Publication Data
US 2009/0085671 A1    Apr. 2, 2009

Related U.S. Application Data

(60) Provisional application No. 60/975,778, filed on Sep. 27, 2007.

(51) Int. Cl.
*H03F 3/45* (2006.01)
(52) U.S. Cl. .......................... 330/253; 330/51
(58) Field of Classification Search .................. 330/51, 330/252, 253, 261
See application file for complete search history.

(56) References Cited

U.S. PATENT DOCUMENTS

| | | | |
|---|---|---|---|
| 3,703,685 A | 11/1972 | Simopoulos et al. | |
| 5,021,745 A | 6/1991 | Kondou et al. | |
| 5,872,489 A | 2/1999 | Chang et al. | |
| 6,292,378 B1 | 9/2001 | Brooks et al. | |
| 6,304,206 B1 | 10/2001 | Wada et al. | |
| 6,417,737 B1* | 7/2002 | Moloudi et al. | 330/301 |
| 6,472,936 B1 | 10/2002 | Jones | |
| 6,704,559 B1 | 3/2004 | Hageraats | |
| 6,816,718 B2 | 11/2004 | Yan et al. | |
| 6,867,649 B2 | 3/2005 | Lehto | |
| 7,019,593 B2 | 3/2006 | Krishnasamy Maniam et al. | |
| 7,079,860 B1 | 7/2006 | Yamamoto et al. | |
| 7,233,772 B1* | 6/2007 | Darabi et al. | 455/20 |
| 7,486,135 B2 | 2/2009 | Mu | |
| 7,521,996 B2* | 4/2009 | Kluge | 330/252 |
| 2005/0093630 A1 | 5/2005 | Whittaker et al. | |
| 2005/0174175 A1 | 8/2005 | Heigelmayer et al. | |
| 2009/0085668 A1 | 4/2009 | Gao et al. | |

FOREIGN PATENT DOCUMENTS

| | | |
|---|---|---|
| JP | 5-83049 | 4/1993 |
| JP | 8-139534 | 5/1996 |
| JP | 2006-262265 | 9/2006 |
| WO | WO 2009/042777 | 4/2009 |

OTHER PUBLICATIONS

International Search Report and Written Opinion issued in International Application No. PCT/US2008/077493, dated Jan. 8, 2009, 12 pages.
Office Action issued in U.S. Appl. No. 12/237,132 dated Oct. 20, 2009.
PCT International Search Report and Written Opinion issued in International Application No. PCT/US2008/077690 mailed Jan. 9, 2009, 11 pages.

* cited by examiner

*Primary Examiner*—Henry K Choe
(74) *Attorney, Agent, or Firm*—Fish & Richardson P.C.

(57) ABSTRACT

Sharing one or more load inductors comprises receiving a first input signal at a first terminal of a first amplifier and amplifying the first input signal using the first amplifier. The first amplifier is coupled to one or more load inductors at a second terminal of the first amplifier and is coupled to one or more dedicated source inductors at a third terminal of the first amplifier. Also, a second input signal is received at a first terminal of a second amplifier amplifying the second input signal using the second amplifier. The second amplifier is coupled to the one or more load inductors at a second terminal of the second amplifier and is coupled to one or more dedicated source inductors at a third terminal of the second amplifier.

36 Claims, 7 Drawing Sheets

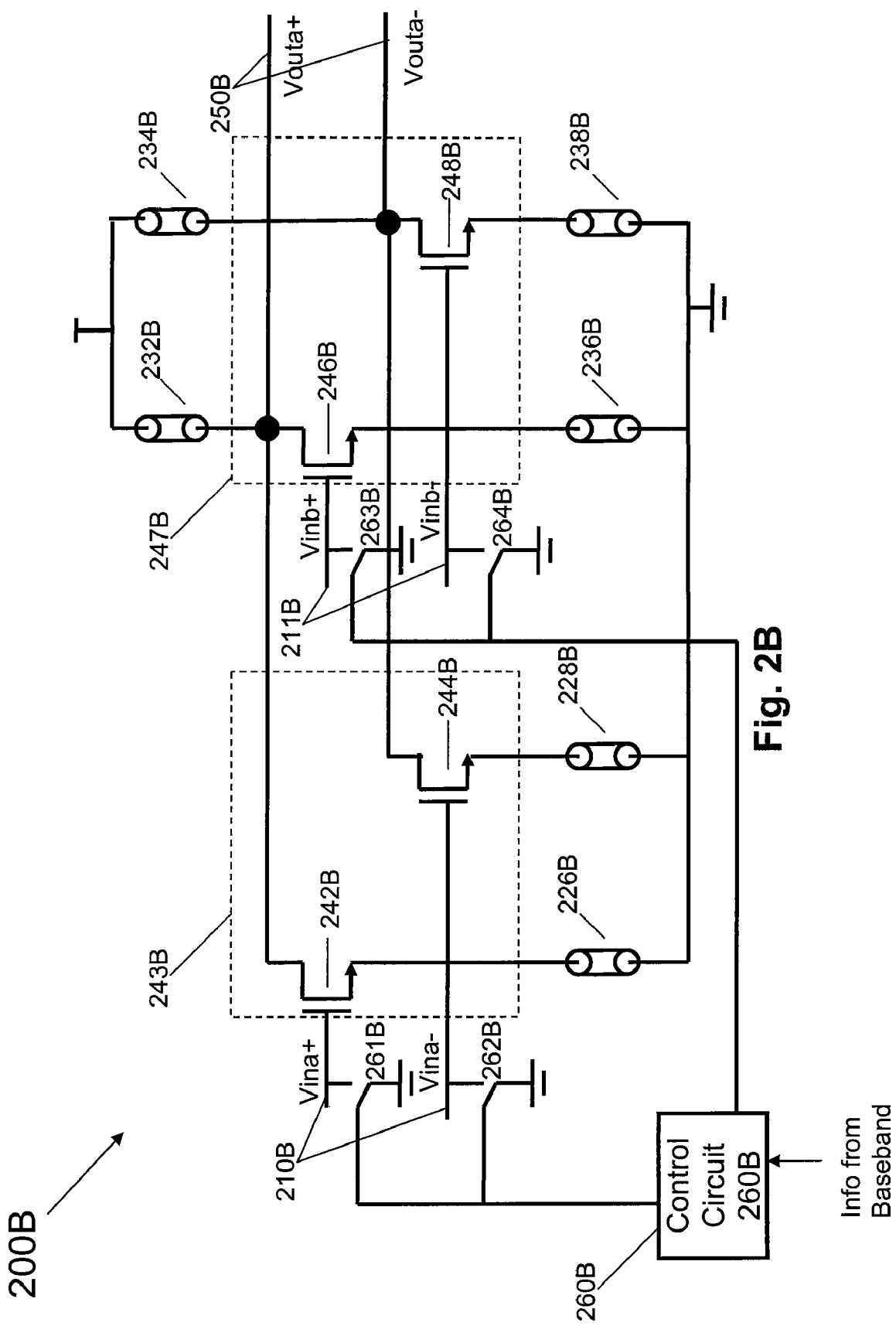

LOAD INDUCTOR SHARING

CROSS REFERENCE TO RELATED APPLICATIONS

This application claims the benefit of priority from U.S. Provisional Application entitled "LOAD INDUCTOR SHARING", Application No. 60/975,778 filed Sep. 27, 2007, the disclosure of which is incorporated by reference.

TECHNICAL FIELD

This disclosure generally relates to the use and design of inductors in radio frequency circuitry.

BACKGROUND

Communication systems which utilize radio frequency (RF) signals often include the use of low noise amplifiers (LNAs) to amplify portions of received RF signals. LNAs are often selected for their ability amplify the typically weak signals of RF signals while maintaining a low noise figure. Also, use of LNAs typically includes use of source and load inductors in conjunction with transistors or field effect devices.

SUMMARY

According to one general aspect, a method for sharing one or more load inductors comprises receiving a first input signal at a first terminal of a first amplifier and amplifying the first input signal using the first amplifier. The first amplifier is coupled to one or more load inductors at a second terminal of the first amplifier and is coupled to one or more dedicated source inductors at a third terminal of the first amplifier. The method also includes receiving a second input signal at a first terminal of a second amplifier amplifying the second input signal using the second amplifier. The second amplifier is coupled to the one or more load inductors at a second terminal of the second amplifier and is coupled to one or more dedicated source inductors at a third terminal of the second amplifier.

These and other implementations can optionally include one or more of the following features. For example, the method can include disabling the amplification of the first amplifier during a first time period in which the second amplifier is amplifying the second input signal and disabling the amplification of the second amplifier during a second time period in which the first amplifier is amplifying the first input signal. Disabling the amplification of the first amplifier can include switching the first terminal of the first amplifier to ground. Disabling the amplification of the first or the second amplifier can include disconnecting the one or more load inductors. Disabling the amplification of the first or the second amplifier can include disconnecting a power supply. Disabling the amplification of the first and the second amplifiers can include using a control circuit such that the control circuit is configured to switch the first terminal of the first amplifier to ground and to switch the first terminal of the second amplifier to ground Also, amplifying the first or second input signals can include using a control circuit such that the control circuit is configured to control a first switch such that the first amplifier is active and the control circuit is configured to concurrently control a second switch such that the second amplifier is not active. The control circuit can be configured to not activate the first amplifier and the second amplifier concurrently. Amplifying the first input signal using the first amplifier can include amplifying the first input signal only at times when the second amplifier is not active. The first input signal can be a first differential input signal and the second input signal can be a second differential input signal. The first amplifier can include a first differential amplifier and the second amplifier can include a second differential amplifier. The one or more load inductors can include a pair of load inductors of equal value and the one or more dedicated source inductors coupled to the third terminal of the first amplifier can include a first pair of source indictors of equal value and the one or more dedicated source inductors coupled to the third terminal of the second amplifier can include a second pair of source inductors of equal value.

Further, the first input signal can have a first center frequency and the second input signal can have a second, different, center frequency. The first amplifier can be dedicated to a first frequency band with a first center frequency and the second amplifier can be dedicated to a second, different, frequency band with a second center frequency. The difference of the first and second center frequencies can be within a defined frequency bandwidth. The first and the second amplifiers are low noise amplifiers with a cascode topology. The first and the second amplifiers can be low noise amplifiers with a single transistor topology which include one transistor for a single ended input signal and two transistors for a differential input signal. The second terminal of the first amplifier can be coupled to the second terminal of the second amplifier.

According to a second general aspect, a method for sharing one or more load inductors comprises coupling a first input terminal to a first terminal of a first amplifier and coupling at least one load inductor to a second terminal of the first amplifier. The method also includes coupling one or more dedicated source inductors to a third terminal of the first amplifier and coupling a second input terminal to a first terminal of a second amplifier. The method further includes coupling the at least one load inductor to a second terminal of the second amplifier and coupling one or more dedicated source inductors to a third terminal of the second amplifier.

These and other implementations can optionally include one or more of the following features. For example, the first amplifier can be dedicated to a first frequency band with a first center frequency and the second amplifier can be dedicated to a second, different frequency band with a second center frequency. The difference of the first and second center frequencies can be within a defined frequency bandwidth. The method can include coupling a first output of a control circuit to a first switch such that the control circuit is configured to use the first switch to switch between coupling or not coupling the first terminal of the first amplifier to ground and coupling a second output of the control circuit to a second switch, such that the control circuit is configured to use the second switch to switch between coupling or not coupling the first terminal of the second amplifier to ground. The control circuit can be configured to always couple at least one of the first terminal of the first amplifier and the first terminal of the second amplifier to ground when amplification is being conducted. The first and the second amplifiers can be low noise amplifiers with a cascode topology. The first and the second amplifiers can be low noise amplifiers with a single transistor topology comprising one transistor for a single ended input signal and two transistors for a differential input signal.

Also, the first and second input terminals are differential input terminals, the first terminal of the first amplifier is a differential terminal, and the first terminal of the second amplifier is a differential terminal. Coupling the at least one load inductor to the second terminal of the first amplifier can include coupling a pair of load inductors of equal value to a second differential terminal of the first amplifier and coupling the at least one load inductor to the second terminal of the second amplifier can include coupling the pair of load inductors of equal value to a second differential terminal of the second amplifier. Coupling the one or more dedicated source inductors to the third terminal of the first amplifier can include coupling a first pair of source inductors of equal value to a third differential terminal of the first amplifier and coupling the one or more dedicated source inductors to the third terminal of the second amplifier can include coupling a second pair of source inductors of equal value to a third differential input terminal of the second amplifier. The method can further include coupling the second terminal of the first amplifier to the second terminal of the second amplifier.

According to a third general aspect, a circuit for sharing one or more load inductors includes a first terminal of a first amplifier coupled to a first input terminal and at least one load inductor coupled to a second terminal of the first amplifier. The circuit also includes one or more dedicated source inductors coupled to a third terminal of the first amplifier and a first terminal of a second amplifier coupled to a second input terminal. The circuit further includes a second terminal of the second amplifier coupled to the at least one load inductor and a third terminal of the second amplifier coupled to one or more dedicated source inductor.

These and other implementations can optionally include one or more of the following features. For example, the second terminal of the first amplifier can be coupled to the second terminal of the second amplifier. The first amplifier can be dedicated to a first frequency band and the second amplifier can be dedicated to a second, different, frequency band. The circuit can include a control circuit with an input terminal coupled to a baseband to receive instructions from the baseband, a first switch coupled to the control circuit and configured to switch between coupling or not coupling the first terminal of the first amplifier to ground, and a second switch coupled to the control circuit and configured to switch between coupling or not coupling the first terminal of the second amplifier to ground. The control circuit can be configured to always couple at least one of the first terminal of the first amplifier and the first terminal of the second amplifier to ground when amplification is being conducted.

Also, the first and the second amplifiers can be low noise amplifiers with a cascode topology. The first input terminal can be a single ended input terminal and the second input terminal can be a single ended input terminal. The first and second input terminals can be differential input terminals, the first terminal of the first amplifier can be a differential terminal, and the first terminal of the second amplifier can be a second differential terminal. The first and the second amplifiers can be low noise amplifiers with a single transistor topology comprising one transistor for a single ended input signal and two single transistors for a differential input signal. The first amplifier can include a first differential amplifier and the second amplifier can include a second differential amplifier.

Further, the at least one load inductor coupled to the second terminal of the first amplifier can include a pair of load inductors of equal value coupled to a differential second terminal of the first differential amplifier and a differential second terminal of the second differential amplifier. The one or more dedicated source inductors coupled to the third terminal of the first amplifier can include a first pair of source inductors of equal value coupled to a differential third terminal of the first amplifier and the third terminal of the second amplifier coupled to the one or more dedicated source inductors can include a second pair of source inductors of equal value coupled to a differential third terminal of the second amplifier.

According to a third general aspect, a system with shared one or more load inductors comprises an output terminal of an antenna coupled to input terminals of two or more RF filters and an output terminal of the RF filters coupled to two or more low noise amplifiers (LNAs). The system also includes a shared load inductor coupled to each of the two or more LNAs, such that a shared load inductor is an inductor coupled to more than one LNA and dedicated source degeneration inductors coupled to each of the two or more LNAs, such that a dedicated source degeneration inductor is an inductor coupled to no more than one LNA. The system further includes one or more outputs of the two or more LNAs coupled to a first set of one or more input terminals of a first set of one or more mixers and an output of a first local oscillator coupled to a second set of one or more input terminals of the first set of mixers. The system additionally includes a set of output signals of the first set of mixers filtered by one or more IF filters and one or more output signals of the one or more IF filters amplified by one or more IF amplifiers. Finally, the system includes one or more outputs of the one or more IF amplifiers mixed with an output signal of a second local oscillator by a second set of one or more mixers with outputs coupled to a baseband for further processing and one or more terminals of a first LNA of the two or more LNAs coupled to one or more terminals of a second LNA of the two more LNAs.

The described implementations may be compatible with digital algorithms used in communication systems. Some implementations also may, for example, provide for reduced cost, power and size of circuitry. In particular, by requiring fewer inductors on, for example, silicon, the coupling effects and noise may be reduced for better performance. Load sharing of inductive elements may be able to enable integration to achieve monolithic transceivers or full radios.

The details of one or more implementations are set forth in the accompanying drawings and the description below. Other features will be apparent from the description and drawings, and from the claims.

DESCRIPTION OF THE DRAWINGS

FIGS. 2A and 2B are schematics of examples of circuits employing load inductor sharing.

DETAILED DESCRIPTION

Generally, in multi-band and/or multi-standard receivers, a low-noise amplifier (LNA) circuit can be included for each frequency band. In some implementations described here, two or more load inductors for close frequencies may be shared by, for example, directly or indirectly electrically connecting the load inductors to multiple circuit components. Sharing two or more load inductors may decrease the required space, cost of the circuit, and power consumed compared to using separate load inductors for each LNA.

Load inductor sharing may be employed with LNAs for a number of communication systems. Sharing may be used in, for example, GSM, Extended Global System for Mobile Communication (EGSM), DCS and PCS communications standards. For example, various implementations in quad-band communication standards such as GSM, may reduce required cost and power consumption of the LNA by approximately 25%. The load inductor sharing techniques also may be used in or applied to, for example, multiple stage cascode topology, a single transistor or other topology LNAs, both I and Q phases of the signals, wireless or wireless RF transceivers for 2 or more close frequency bands, wideband code division multiple access (WCDMA) and/or 2G, 3G, 4G wireless standards.

Figure 1:
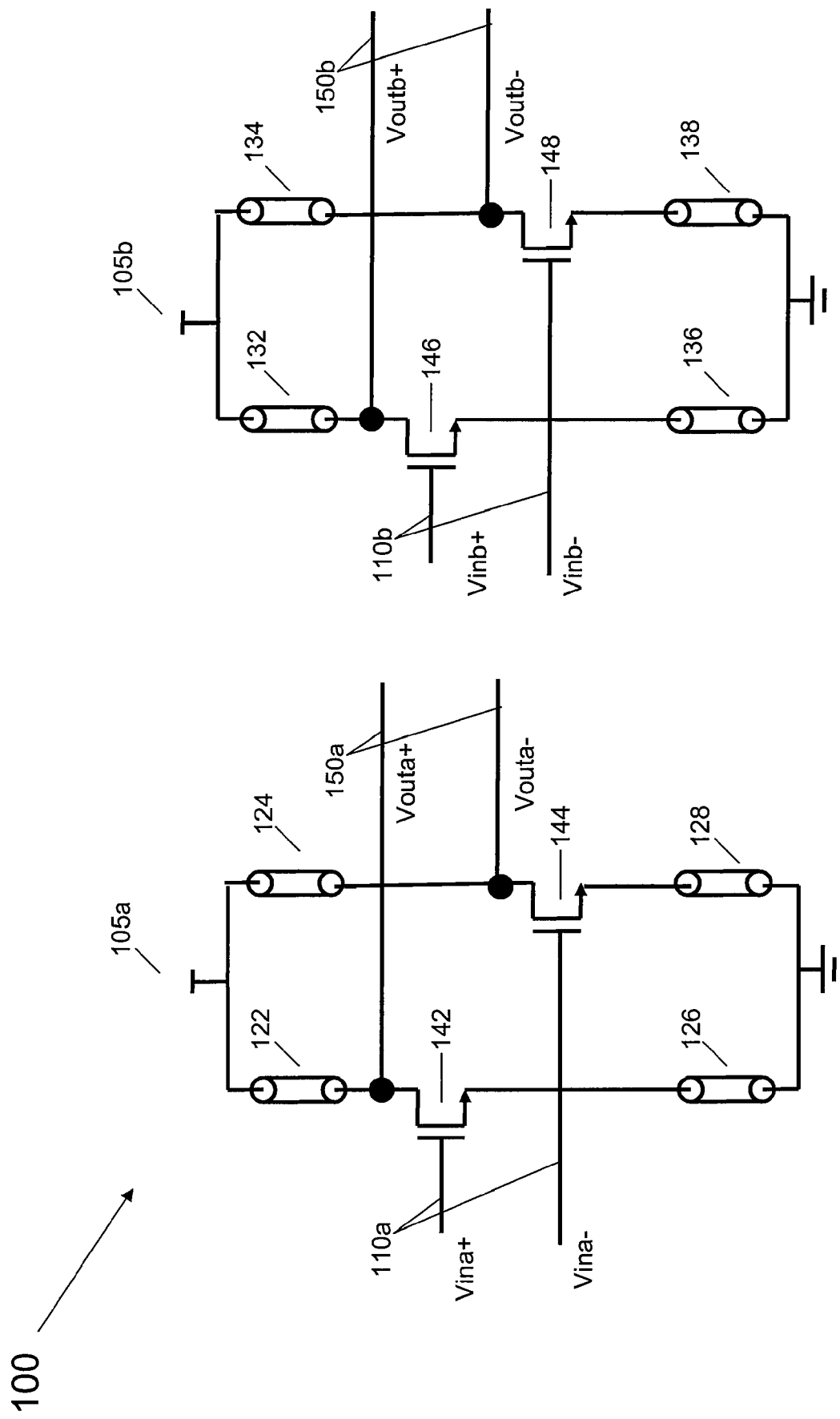
FIG. 1 is a schematic of an example of a circuit with dedicated inductors.

FIG. 1 is a schematic of an example of a circuit 100 with dedicated load inductors for two LNAs 105a and 105b. The circuit 100 includes components for processing at least two bands within a multi-band receiver and specifically includes two inputs 110a and 110b, inductors 122-138, transistors 142-148, and two outputs 150a-150b. The two inputs 110a and 110b can follow an antenna (not shown) or one or more RF filters (not shown) in the receiver, such as a surface acoustic wave (SAW) band select filter. The two outputs 150a and 150b can be the output amplified signals of two different bands and can be connected to one or more following mixers (not shown) of the receiver.

Transistors 142 and 144 form a first differential LNA 105a that uses a first set of inductors 122-128. Transistors 146 and 148 form a second differential LNA 105b that uses a second set of inductors 132-138. The transistors 142 and 144 of the first differential LNA 105a are coupled to a dedicated set of load inductors 122 and 124, which are not coupled to the transistors 146 and 148 of the second differential LNA 105b. Similarly, the transistors 146 and 148 of the second differential LNA 105b are coupled to a dedicated set of load inductors, inductors 132 and 134, which are not coupled to the transistors 142 and 144 of the first differential LNA 105a. As such, the circuit 100 requires space and power for the eight inductors 122-138.

Figure 2A:
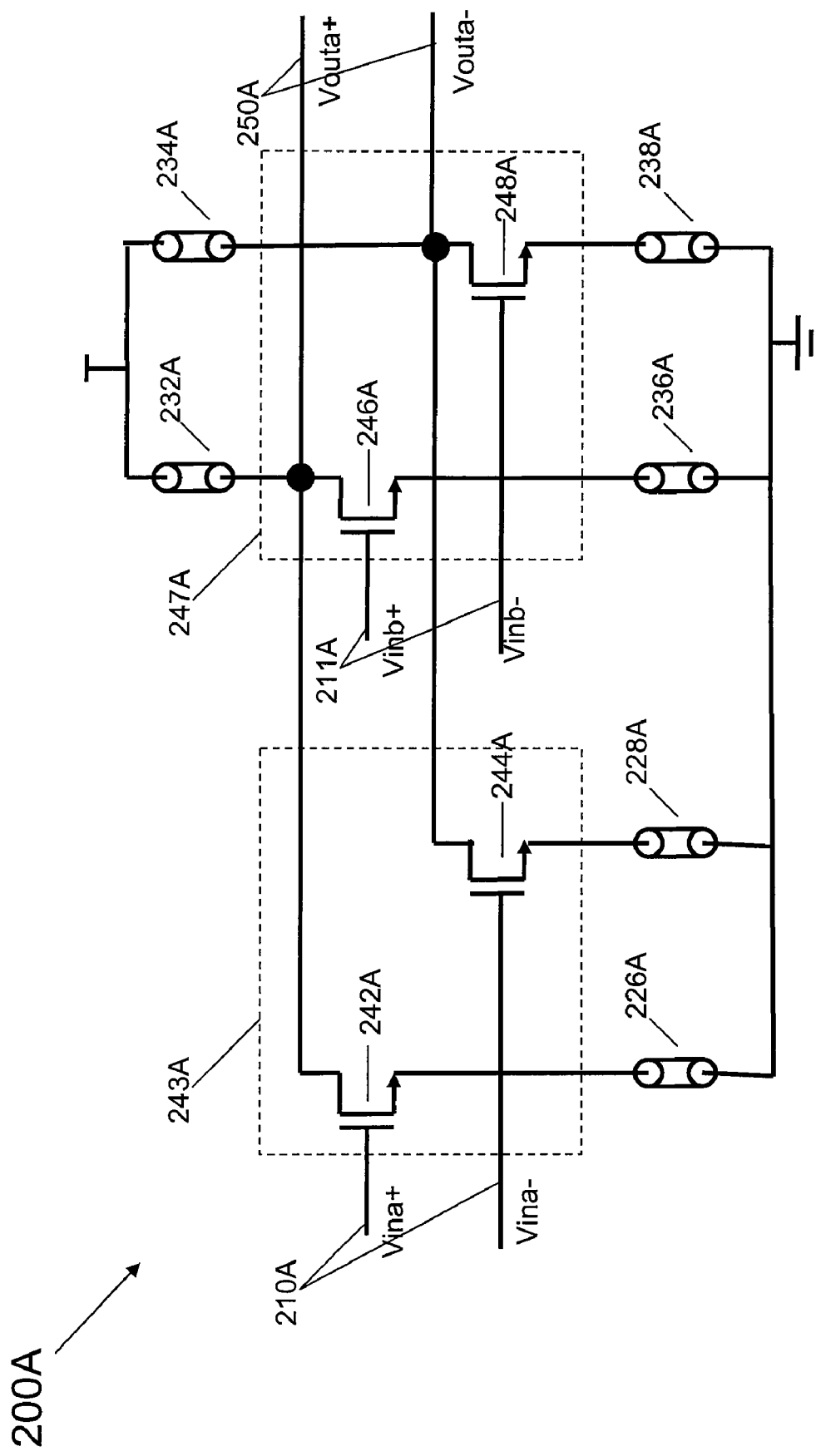

FIG. 2A is a schematic of an example of a LNA circuit 200A employing load inductor sharing for two LNAs 243A and 247A. Specifically, LNA circuit 200A includes two LNAs 243A and 247A for processing two close frequency bands within a multi-band receiver and specifically includes two differential inputs 210A and 211A, load inductors 232A and 234A, source degeneration inductors 226A, 228A, 236A, and 238A, transistors 242-248A, and one differential output 250A. The two differential inputs 210A and 211A can follow an antenna or one or more RF filters, such as a SAW band select filter. The outputs 250A are the output amplified signals, which can represent the active band and can be coupled to a following mixer.

Transistors 242A and 244A form a first LNA 243A, which uses a first set of inductors. The first set of inductors includes shared load inductors 232A and 234A and dedicated (not shared) source degeneration inductors 226A and 228A. Transistors 246A and 248A form a second LNA 247A, which uses a second set of inductors. The second set of inductors also includes shared load inductors 232A and 234A and dedicated source degeneration inductors 236A and 238A. Therefore, shared load inductors 232A and 234A are used by both the first and second LNAs 243A and 247A. As such, the LNA circuit 200A can require less available space and power for the load inductors of the first and second LNAs 243A and 247A than the circuit 100 of FIG. 1. Moreover, the use of dedicated source degeneration inductors in conjunction with shared load inductors can strike a balance between the benefits of sharing load inductors described above and the potential for increase of noise and decrease of circuit performance that may accompany the sharing of load inductors.

In various implementations, when the first LNA 243A is active, the second LNA 247A is shut off with transistors 242A and 244A acting like open circuits. A non-active LNA can be shut-off using various methods, such as, switching an input of the LNA to ground, disconnecting the load inductors, or disconnecting the power supply. These are merely examples of methods for shutting off an LNA. In various implementations, the method and circuits can be applied to LNAs to use GSM 850 MHz and GSM 900 MHz frequency bands, DCS 1800 MHz frequency bands and PCS 1900 MHz frequency bands, WCDMA frequency bands, or other close frequency bands. When sharing load inductors for the LNAs, the load inductors may need to be able to cover the frequency bandwidths of all LNAs. Therefore, there can be an equivalent bandwidth of a maximum frequency which can be the maximum frequency of all frequency bands and a minimum frequency, which can be the minimum frequency of all frequency bands sharing load inductors. In general, if the difference of the center frequencies of the frequency bands is less than a desired frequency bandwidth, the load inductor sharing can be used for the LNAs. The desired frequency bandwidth can be a function of the bandwidths and the center frequencies of the frequency bands and a quality factor of the shared load inductors. As an example, the desired frequency bandwidth for the GSM 850 MHz and EGSM 900 MHz bands is approximately 100 MHz. The frequency difference between the center frequencies of these two bands is within this bandwidth.

FIG. 2B is a schematic of an example of a LNA circuit 200B employing load inductor sharing between two LNAs 243B and 247B. The LNA circuit 200B of FIG. 2B is similar to the LNA circuit 200A of FIG. 2A while further including a control circuit 260B. In particular, the LNA circuit 200B includes two LNAs 243B and 247B for processing two close frequency bands within a multi-band receiver and specifically includes two differential inputs 210B and 211B, load inductors 232B and 234B, source degeneration inductors 226B, 228B, 236B, and 238B, transistors 242-248B, switches 261-264B and one differential output 250B.

Output terminals of the control circuit 260B can be coupled to the controls of the switches 261-264B. An input terminal of the control circuit 260B can be coupled to the baseband to receive instructions to activate the LNAs 243B and 247B. Input terminals of the switches 261-264B are coupled to ground. The switches 261-264B can be switched to connect or disconnect each of the input terminals of the first and second differential LNAs 243B and 247B to ground. The LNAs 243B and 247B can be activated or deactivated by the switches 261-264B controlled by the control circuit 260B. Other implementations may overlap the activation of the first and second LNAs 243B and 247B.

Also, other implementations may use the control circuit 260B to manipulate LNA activation through use of other terminals of the first and second LNAs 243B and 247B. For example, the control circuit can be configured to alternately switch the shared load inductors 232B and 234B to the first or the second LNAs 243B and 247B. The LNAs 243B and 247B can be deactivated by disconnecting the shared load inductors, therefore disconnecting the LNAs 243B and 247B from the power supply.

Figure 3:
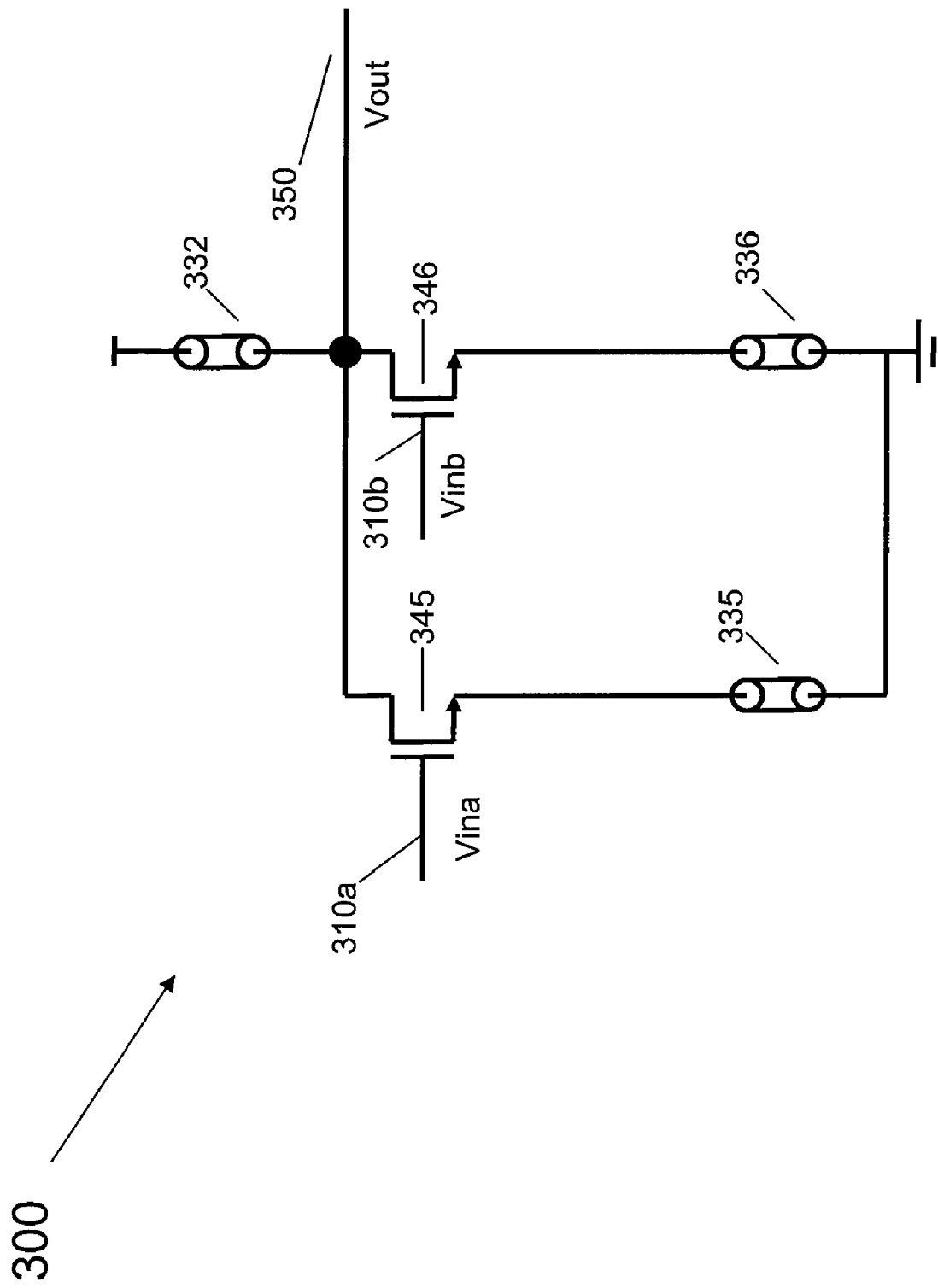
FIG. 3 is a schematic of an example of a circuit employing single-ended load inductor sharing.

FIG. 3 is a schematic of an example of an amplifier circuit 300 employing single-ended load inductor sharing between two transistors 345 and 346. Specifically, the single-ended amplifier circuit 300 includes a first transistor 345 that forms a first amplifier and a second transistor 346 forms a second amplifier. Both transistors 345 and 346 share a load inductor 332 and use dedicated source degeneration inductors 335 and 336, respectively. The output 350 can be an amplified active band output signal. When the first LNA is active, the second LNA can be shut off with the second transistor 346 acting like an open circuit and vice versa using techniques such as those described with respect to FIG. 2B, such as, for example, the switches 261B and 263B controlled by the control circuit 260B. The single-ended amplifier circuit 300 can employ the load inductor sharing techniques while further reducing power requirements, size, and cost requirements. Also, circuitry of the single-ended amplifier circuit 300 can be reduced in some implementations by a factor of about two when compared to differential LNA designs, such as, for example, the LNA circuit 200A of FIG. 2A.

Figure 4:
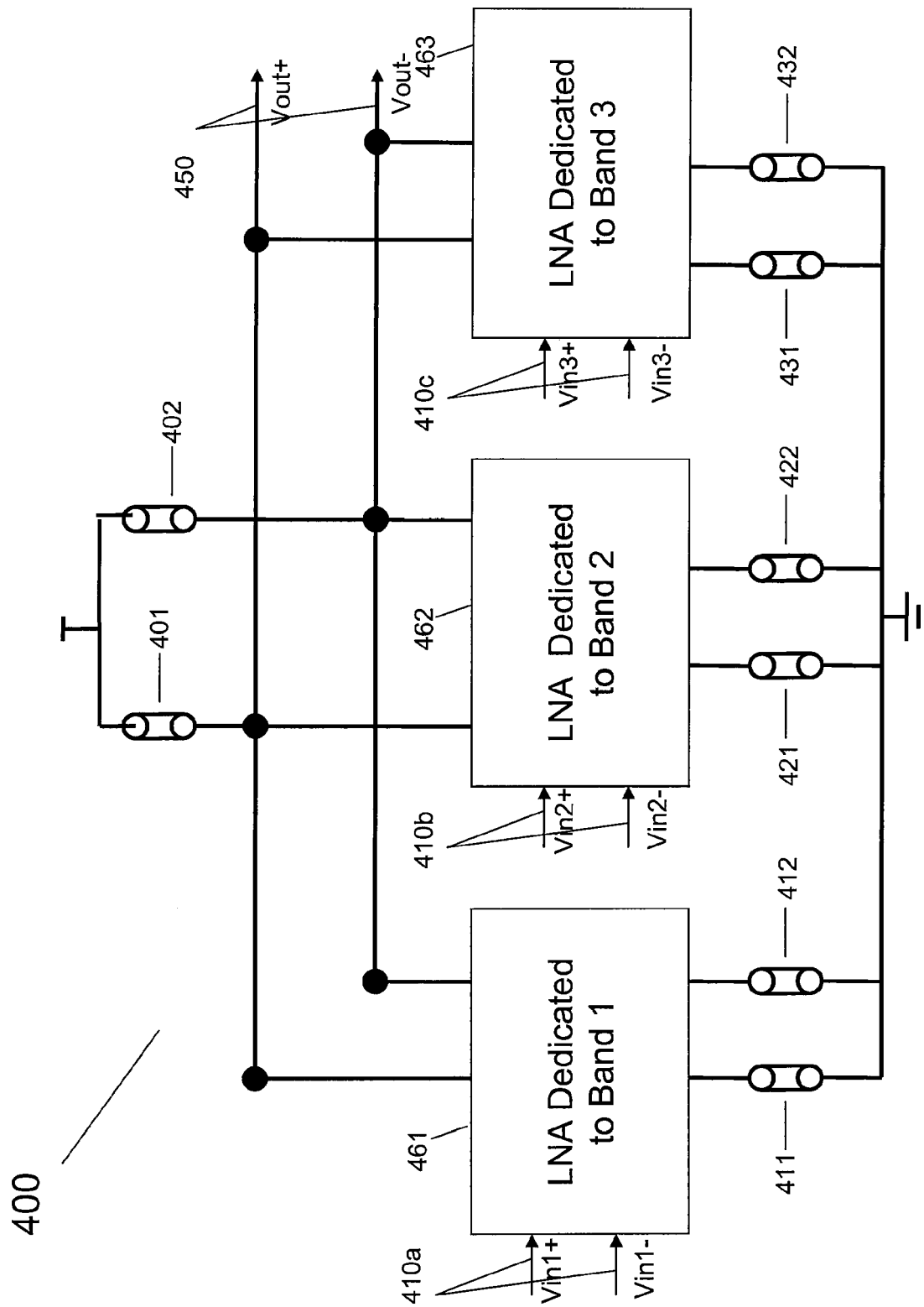
FIG. 4 is a schematic of an example of a circuit employing load inductor sharing for a group of amplifiers.

FIG. 4 is a schematic of an example of a multiple LNA circuit 400 employing load inductor sharing for a group of LNAs. In particular, the multiple LNA circuit 400, as shown, includes three LNAs 461-463. The multiple LNA circuit 400 can be adapted to share load inductors for LNAs within close frequency bands. One implementation shares load inductors with LNAs that have center frequencies approximately within 10% of each other.

Each of the LNAs 461-463 are dedicated to a separate frequency band. The multiple LNA circuit 400 includes differential inputs 410a, 410b, and 410c for LNAs 461, 462, and 463, respectively. The multiple LNA circuit 400 also includes a shared pair of load inductors 401 and 402 and dedicated pairs of source degeneration inductors 411 and 412, 421 and 422, and 431 and 432. The differential output 450 can be a differential amplified active band output signal. The LNAs 461-463 can be circuits of single transistor, multiple transistors, cascode topology or other topologies. When one LNA is active, the other LNAs can be shut off and acting like an open circuit by switching LNA inputs to ground or by other methods, including, for example, the methods described with respect to FIG. 2B. In this manner, a load inductor may be shared between amplifiers of different frequency bands such that a load inductor in one moment can be used in amplifier hardware dedicated to a first frequency band and in another moment can be used in amplifier hardware dedicated to a second frequency band. By sharing only one pair of load inductors for multiple LNAs, the power, noise, size and cost can be further reduced.

Figure 5:
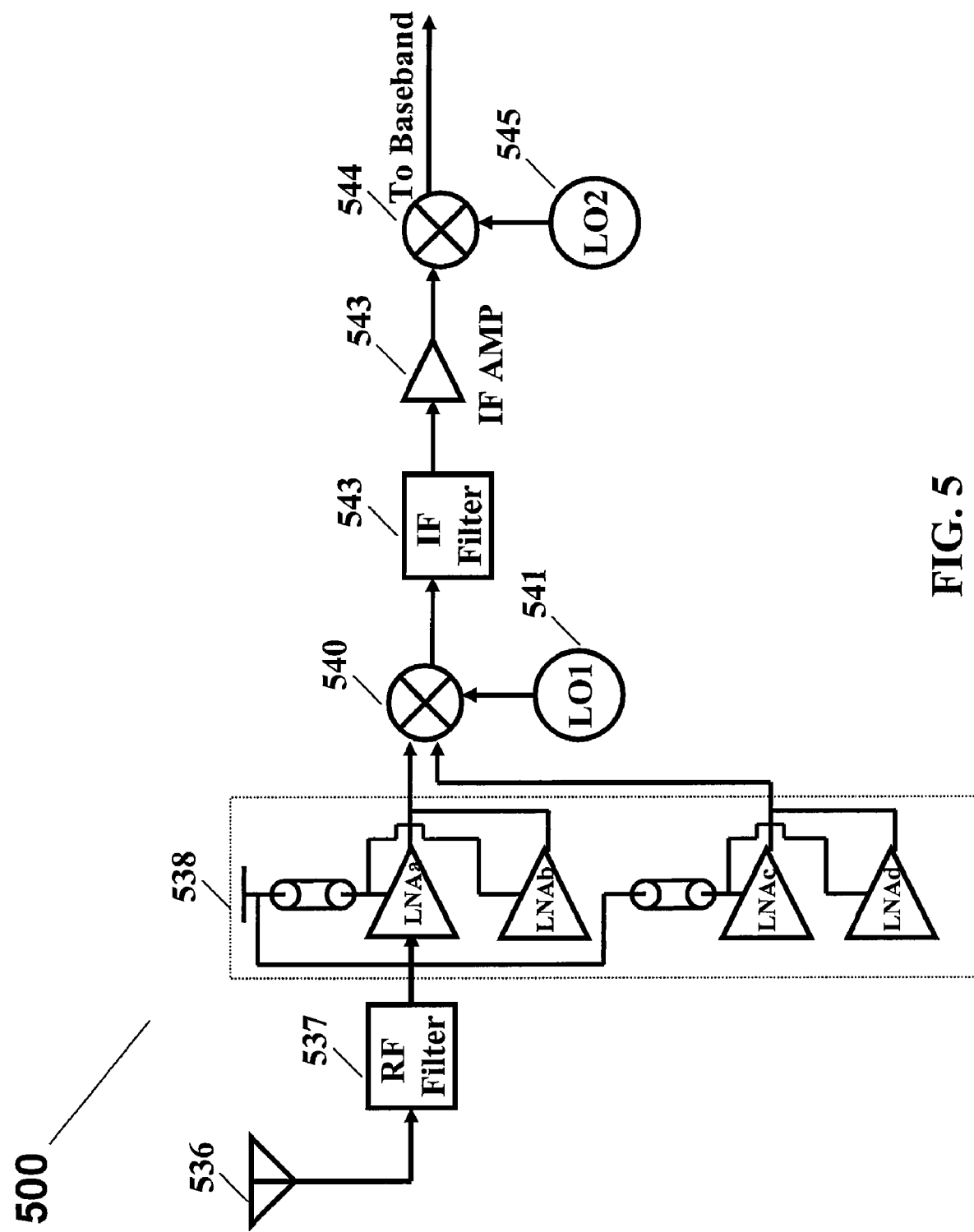
FIG. 5 is a schematic of an example of a multiband low intermediate frequency (IF) receiver.
Figure 6:
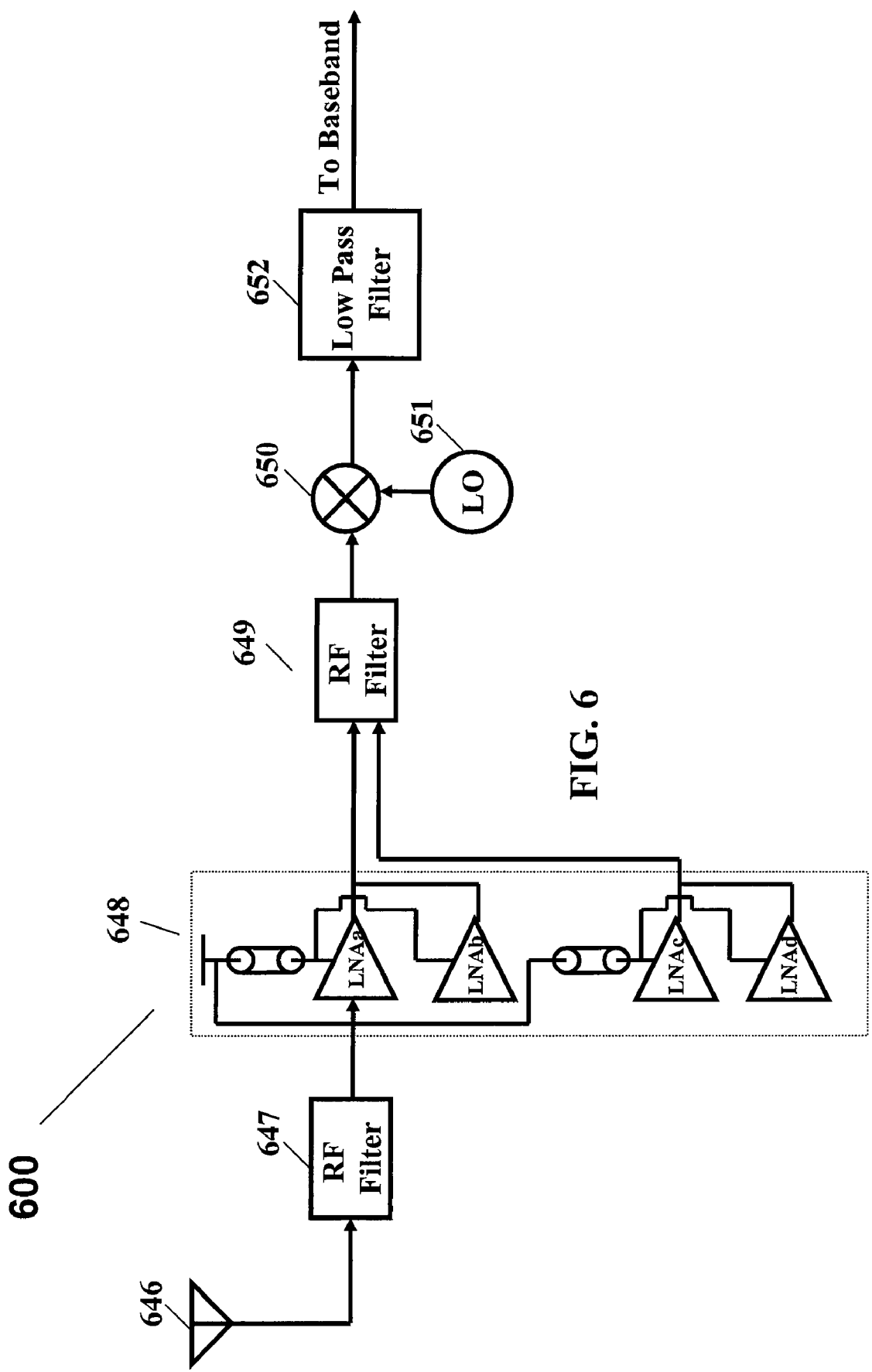
FIG. 6 is a schematic of an example of a direct-conversion receiver.

The disclosed techniques can be used with wireless communication systems. For example, the disclosed techniques can be used with receivers and transceivers, such as the receiver and/or transceiver architectures for superheterodyne receivers, image-rejection (e.g., Hartley, Weaver) receivers, zero-intermediate frequency (IF) receivers, low-IF receivers, direct-up transceivers, two-step up transceivers, and other types of receivers and transceivers for wireless and wireline technologies. FIGS. 5 and 6 are schematics demonstrating two examples of systems in which the inductor sharing techniques described above can be used.

In particular, FIG. 5 is a schematic of an example of a multiband low-IF receiver 500. A RF signal arriving at an antenna 536 passes through an array of RF filters 537, an array of LNAs 538 comprising pairs of LNAs for two close frequency bands, such as, for example, 850 MHz GSM and 900 MHz EGSM (Extended GSM) bands, and 1800 MHz DCS (Digital Cellular System) and 1900 MHz PCS bands into a mixer 540, which performs image rejection and produces a low IF RF signal by mixing it with the signal produced by the first LO 541. The array of LNAs 538 can use the inductor sharing techniques described above. For example, in various implementations, the array of LNAs 538 can share inductors connected to the source of the LNA's metal-oxide semiconductor field effect transistors (MOSFETs) or other transistors. One implementation is to share one pair of load inductors between the 850 MHz GSM LNA and the 900 MHz EGSM LNA, and another pair of load inductors between the 1800 MHz DCS LNA and the 1900 MHz PCS LNA.

The undesired mixer products in the IF signal are rejected by an IF filter 542. The filtered IF signal then enters an IF amplifier stage 543, after which the output feeds into the second mixer 544 that translates it down to the baseband frequency by mixing it with the signal produced by a second LO 545. The signal is then sent to the baseband for processing. Tuning into a particular channel within the band-limited RF signal is accomplished by varying the frequency of each LO 541 and 545.

In another example, FIG. 6 is a schematic of an example of a direct-conversion receiver 600. In the receiver 600, an antenna 646 couples a RF signal through a first array of bandpass RF filters 647 into an array of LNAs 648. The array of LNAs 648 can use the inductor sharing techniques described above. For example, in various implementations, the array of LNAs 648 can share inductors connected to the drain of the LNA's MOSFETs or other transistors.

The signal then proceeds through a second array of RF filters 649, yielding a band-limited RF signal, which then enters a mixer 650 and mixes with an LO frequency produced by an LO 651. The output of the mixer 650 is coupled into a low pass analog filter 652 before proceeding into baseband information signal for use by the remainder of the communications system.

A non-active LNA can be shut off like an open circuit by switching the LNA inputs to ground, by disconnecting the LNA from the power supply and/or from the load inductors or by any digital or analog control circuits. The load and source inductors can be spiral inductors or any other shape and type inductors designed manually or by software programs.

In some implementations, circuit components can be exchanged from the disclosed figures with minimal change in circuit functionality. Various topologies for circuit models can be used. The exemplary designs may use various process technologies, such as CMOS or BiCMOS (Bipolar-CMOS) process technology, or Silicon Germanium (SiGe) technology. The circuits can be single-ended or fully-differential circuits.

The system can include other components. Some of the components may include computers, processors, clocks, radios, signal generators, counters, test and measurement equipment, function generators, oscilloscopes, phase-locked loops, frequency synthesizers, phones, wireless communication devices, and components for the production and transmission of audio, video, and other data. The number and order of variable gain and filter stages can vary.

What is claimed:

1. A method for sharing one or more load inductors comprising:
   receiving a first input signal at a first terminal of a first amplifier;
   amplifying the first input signal using the first amplifier, wherein the first amplifier is coupled to one or more load inductors at a second terminal of the first amplifier and is coupled to one or more dedicated source inductors at a third terminal of the first amplifier;
   receiving a second input signal at a first terminal of a second amplifier;

amplifying the second input signal using the second amplifier, wherein the second amplifier is coupled to the one or more load inductors at a second terminal of the second amplifier and is coupled to one or more dedicated source inductors at a third terminal of the second amplifier; and disabling the amplification of the first amplifier during a first time period in which the second amplifier is amplifying the second input signal and disabling the amplification of the second amplifier during a second time period in which the first amplifier is amplifying the first input signal.

2. The method of claim 1 wherein disabling the amplification of the first amplifier includes switching the first terminal of the first amplifier to ground.

3. The method of claim 1 wherein disabling the amplification of the first or the second amplifier includes disconnecting the one or more load inductors.

4. The method of claim 1 wherein disabling the amplification of the first or the second amplifier includes disconnecting a power supply.

5. The method of claim 1 wherein disabling the amplification of the first and the second amplifiers includes using a control circuit, wherein the control circuit is configured to switch the first terminal of the first amplifier to ground and to switch the first terminal of the second amplifier to ground.

6. The method of claim 1 wherein amplifying the first or second input signals includes using a control circuit, wherein:
the control circuit is configured to control a first switch such that the first amplifier is active, and
the control circuit is configured to concurrently control a second switch such that the second amplifier is not active.

7. The method of claim 6 wherein the control circuit is configured to not activate the first amplifier and the second amplifier concurrently.

8. A method for sharing one or more load inductors comprising:
receiving a first input signal at a first terminal of a first amplifier;
amplifying the first input signal using the first amplifier, wherein the first amplifier is coupled to one or more load inductors at a second terminal of the first amplifier and is coupled to one or more dedicated source inductors at a third terminal of the first amplifier;
receiving a second input signal at a first terminal of a second amplifier; and
amplifying the second input signal using the second amplifier, wherein the second amplifier is coupled to the one or more load inductors at a second terminal of the second amplifier and is coupled to one or more dedicated source inductors at a third terminal of the second amplifier,
wherein amplifying the first input signal using the first amplifier includes amplifying the first input signal only at times when the second amplifier is not active.

9. The method of claim 8 wherein the first input signal is a first differential input signal and the second input signal is a second differential input signal.

10. A method for sharing one or more load inductors comprising:
receiving a first input signal at a first terminal of a first amplifier;
amplifying the first input signal using the first amplifier, wherein the first amplifier is coupled to one or more load inductors at a second terminal of the first amplifier and is coupled to one or more dedicated source inductors at a third terminal of the first amplifier;
receiving a second input signal at a first terminal of a second amplifier; and
amplifying the second input signal using the second amplifier, wherein the second amplifier is coupled to the one or more load inductors at a second terminal of the second amplifier and is coupled to one or more dedicated source inductors at a third terminal of the second amplifier,
wherein the first input signal is a first differential input signal and the second input signal is a second differential input signal,
wherein the first amplifier includes a first differential amplifier and the second amplifier includes a second differential amplifier.

11. The method of claim 10 wherein:
the one or more load inductors includes a pair of load inductors of equal value; and
the one or more dedicated source inductors coupled to the third terminal of the first amplifier includes a first pair of source indictors of equal value and the one or more dedicated source inductors coupled to the third terminal of the second amplifier includes a second pair of source inductors of equal value.

12. The method of claim 1 wherein the first input signal has a first center frequency and the second input signal has a second, different, center frequency.

13. The method of claim 1 wherein the first amplifier is dedicated to a first frequency band with a first center frequency and the second amplifier is dedicated to a second, different, frequency band with a second center frequency.

14. The method of claim 13 wherein the difference of the first and second center frequencies are within a defined frequency bandwidth.

15. The method of claim 1 wherein the first and the second amplifiers are low noise amplifiers with a cascode topology.

16. The method of claim 1 wherein the first and the second amplifiers are low noise amplifiers with a single transistor topology which includes one transistor for a single ended input signal or two transistors for a differential input signal.

17. The method of claim 1 wherein the second terminal of the first amplifier is coupled to the second terminal of the second amplifier.

18. A method for sharing one or more load inductors comprising:
coupling a first input terminal to a first terminal of a first amplifier;
coupling at least one load inductor to a second terminal of the first amplifier;
coupling one or more dedicated source inductors to a third terminal of the first amplifier;
coupling a second input terminal to a first terminal of a second amplifier;
coupling the at least one load inductor to a second terminal of the second amplifier; and
coupling one or more dedicated source inductors to a third terminal of the second amplifier,
wherein the first and second input terminals are differential input terminals, the first terminal of the first amplifier is a differential terminal, and the first terminal of the second amplifier is a differential terminal.

19. The method of claim 18 wherein the first amplifier is dedicated to a first frequency band with a first center frequency and the second amplifier is dedicated to a second, different frequency band with a second center frequency.

20. The method of claim 18 wherein the difference of the first and second center frequencies are within a defined frequency bandwidth.

21. The method of claim 18 further comprising:
coupling a first output of a control circuit to a first switch, wherein the control circuit is configured to use the first switch to switch between coupling or not coupling the first terminal of the first amplifier to ground; and
coupling a second output of the control circuit to a second switch, wherein the control circuit is configured to use the second switch to switch between coupling or not coupling the first terminal of the second amplifier to ground.

22. The method of claim 21 wherein the control circuit is configured to always couple at least one of the first terminal of the first amplifier and the first terminal of the second amplifier to ground when amplification is being conducted.

23. The method of claim 18 wherein the first and the second amplifiers are low noise amplifiers with a cascode topology.

24. The method of claim 18 wherein the first and the second amplifiers are low noise amplifiers with two transistors for a differential input signal.

25. The method of claim 18 wherein:
coupling the at least one load inductor to the second terminal of the first amplifier includes coupling a pair of load inductors of equal value to a second differential terminal of the first amplifier; and
coupling the at least one load inductor to the second terminal of the second amplifier includes coupling the pair of load inductors of equal value to a second differential terminal of the second amplifier.

26. The method of claim 25 wherein:
coupling the one or more dedicated source inductors to the third terminal of the first amplifier includes coupling a first pair of source inductors of equal value to a third differential terminal of the first amplifier; and
coupling the one or more dedicated source inductors to the third terminal of the second amplifier includes coupling a second pair of source inductors of equal value to a third differential input terminal of the second amplifier.

27. The method of claim 18 further comprising coupling the second terminal of the first amplifier to the second terminal of the second amplifier.

28. A circuit for sharing one or more load inductors comprising:
a first terminal of a first amplifier coupled to a first input terminal;
at least one load inductor coupled to a second terminal of the first amplifier;
one or more dedicated source inductors coupled to a third terminal of the first amplifier;
a first terminal of a second amplifier coupled to a second input terminal;
a second terminal of the second amplifier coupled to the at least one load inductor; and
a third terminal of the second amplifier coupled to one or more dedicated source inductor,
wherein the first and second input terminals are differential input terminals, the first terminal of the first amplifier is a differential terminal, and the first terminal of the second amplifier is a second differential terminal.

29. The circuit of claim 28 wherein the second terminal of the first amplifier is coupled to the second terminal of the second amplifier.

30. The circuit of claim 28 wherein the first amplifier is dedicated to a first frequency band and the second amplifier is dedicated to a second, different, frequency band.

31. A circuit for sharing one or more load inductors comprising:
a first terminal of a first amplifier coupled to a first input terminal;
at least one load inductor coupled to a second terminal of the first amplifier;
one or more dedicated source inductors coupled to a third terminal of the first amplifier;
a first terminal of a second amplifier coupled to a second input terminal;
a second terminal of the second amplifier coupled to the at least one load inductor;
a third terminal of the second amplifier coupled to one or more dedicated source inductor;
a control circuit with an input terminal coupled to a baseband to receive instructions from the baseband;
a first switch coupled to the control circuit and configured to switch between coupling or not coupling the first terminal of the first amplifier to ground; and
a second switch coupled to the control circuit and configured to switch between coupling or not coupling the first terminal of the second amplifier to ground.

32. The circuit of claim 31 wherein the control circuit is configured to always couple at least one of the first terminal of the first amplifier and the first terminal of the second amplifier to ground when amplification is being conducted.

33. The circuit of claim 28 wherein the first and the second amplifiers are low noise amplifiers with a cascode topology.

34. The circuit of claim 28 wherein the first and the second amplifiers are low noise amplifiers two single transistors for a differential input signal.

35. The circuit of claim 28 wherein the at least one load inductor coupled to the second terminal of the first amplifier includes a pair of load inductors of equal value coupled to a differential second terminal of the first differential amplifier and a differential second terminal of the second differential amplifier.

36. The circuit of claim 35 wherein:
the one or more dedicated source inductors coupled to the third terminal of the first amplifier includes a first pair of source inductors of equal value coupled to a differential third terminal of the first amplifier; and
the third terminal of the second amplifier coupled to the one or more dedicated source inductors includes a second pair of source inductors of equal value coupled to a differential third terminal of the second amplifier.

* * * * *

UNITED STATES PATENT AND TRADEMARK OFFICE
CERTIFICATE OF CORRECTION

PATENT NO. : 7,649,416 B2  Page 1 of 1
APPLICATION NO. : 12/236344
DATED : January 19, 2010
INVENTOR(S) : David H. Shen et al.

It is certified that error appears in the above-identified patent and that said Letters Patent is hereby corrected as shown below:

In Column 10, line 65 (claim 20), delete "18" and insert --19--.

Signed and Sealed this

First Day of June, 2010

David J. Kappos
*Director of the United States Patent and Trademark Office*